US 6,720,641 B1

(12) United States Patent
Birdsley et al.

(10) Patent No.: US 6,720,641 B1
(45) Date of Patent: Apr. 13, 2004

(54) SEMICONDUCTOR STRUCTURE HAVING BACKSIDE PROBE POINTS FOR DIRECT SIGNAL ACCESS FROM ACTIVE AND WELL REGIONS

(75) Inventors: Jeffrey David Birdsley, Austin, TX (US); Rosalinda M. Ring, Austin, TX (US); Rama R. Goruganthu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 726 days.

(21) Appl. No.: 09/166,656

(22) Filed: Oct. 5, 1998

(51) Int. Cl.[7] .......................... H01L 29/40; H01L 23/58
(52) U.S. Cl. .................... 257/621; 257/48; 257/698; 438/15; 438/667
(58) Field of Search ................ 257/48, 698, 621, 257/276; 438/11, 14, 15, 16, 17, 18, 667; 324/757

(56) References Cited

U.S. PATENT DOCUMENTS

| | | | | |
|---|---|---|---|---|
| 3,787,252 A | * | 1/1974 | Filippazzi et al. | 438/667 |
| 4,889,832 A | * | 12/1989 | Chatterjee | 257/774 |
| 4,992,764 A | * | 2/1991 | Ayasli | 257/276 |
| 5,291,129 A | * | 3/1994 | Kazama | 324/158 P |
| 5,424,245 A | | 6/1995 | Gurtler et al. | |
| 5,497,023 A | * | 3/1996 | Nakazato et al. | 257/372 |
| 5,783,462 A | * | 7/1998 | Huang | 438/17 |
| 5,807,783 A | * | 9/1998 | Gaul et al. | 438/667 |

* cited by examiner

*Primary Examiner*—Ori Nadav

(57) ABSTRACT

A semiconductor structure that includes an electrically conductive probe that extends from the back side of an integrated circuit to a selected region within the substrate. The structure includes a substrate having first and second surfaces. An active region is disposed in the substrate, and an electrically conductive probe extends from the first surface of the substrate to the active region. Probes can also be constructed to connect one to another and with well regions within the substrate.

23 Claims, 4 Drawing Sheets

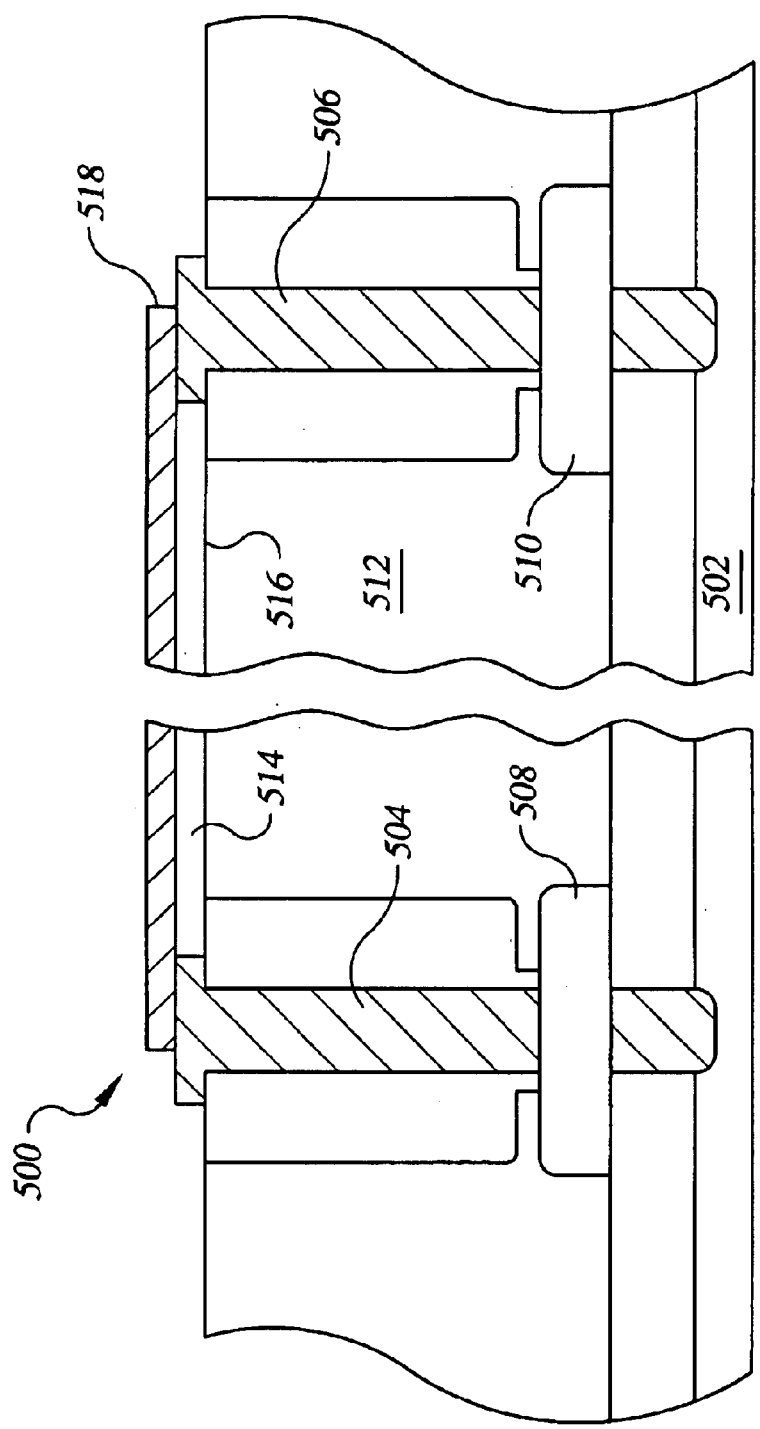

SEMICONDUCTOR STRUCTURE HAVING BACKSIDE PROBE POINTS FOR DIRECT SIGNAL ACCESS FROM ACTIVE AND WELL REGIONS

RELATED PATENT APPLICATIONS

This patent application is related to patent applications: "A SEMICONDUCTOR STRUCTURE WITH A BACKSIDE PROTECTIVE LAYER AND BACKSIDE PROBES AND A METHOD FOR CONSTRUCTING THE STRUCTURE" having application Ser. No. 09/166,266, now U.S. Pat. No. 6,300,148, by Birdsley et al.; and "ENDPOINT DETECTION FOR THINNING OF A FLIP CHIP BONDED INTEGRATED CIRCUIT" having application Ser. No. 09/166,833 by Birdsley et al.; all filed concurrent with the present application on Oct. 5, 1998, assigned to the assignee of the present invention, and incorporated herein by reference.

FIELD OF THE INVENTION

The present invention is generally directed to semiconductor structures, and more particularly to a semiconductor structure having electrically conductive probes extending from a backside of the semiconductor structure to selected regions in the substrate of the semiconductor structure.

BACKGROUND OF THE INVENTION

During manufacture of an integrated circuit, electronic components are formed upon and within a front side surface of a semiconductor structure having opposed front side and backside surfaces. The components are inter-coupled with electrically conductive interconnect lines to form an electronic circuit. Signal lines that are to be connected to external devices are terminated at flat metal contact regions called input/output (I/O) pads. Following manufacture, the integrated circuit, or "chip," is typically secured within a protective semiconductor device package. Each I/O pad of the chip is then connected to one or more terminals of the device package. The terminals of a device package are typically arranged about the periphery of the package. The I/O pads of the chip are electrically connected to the terminals of the device package. Some types of device packages have terminals called "pins" for insertion into holes in a printed circuit board (PCB). Other types of device packages have terminals called "leads" for attachment to flat metal contact regions on an exposed surface of a PCB.

As integrated circuit fabrication technology improves, manufacturers are able to integrate more and more functions onto single silicon substrates. As the number of functions on a single chip increases, however, the number of signal lines that need to be coupled to external devices also increases. The corresponding numbers of required I/O pads and device package terminals increase as well, as do the complexities and costs of the device packages. Constraints of high-volume PCB assembly operations place lower limits on the physical dimensions of and distances between device package terminals. As a result, the areas of peripheral-terminal device packages having hundreds of terminals are largely proportional to the number of terminals. These larger packages with fine-pitch leads are subject to mechanical damage during handling or testing. Mishandling can result in a loss of lead co-planarity, adversely affecting PCB assembly yields. In addition, the lengths of signal lines from chip I/O pads to device package terminals increase with the number of terminals, and the high frequency electrical performance of larger peripheral-terminal device packages suffers as a result.

Grid array semiconductor device packages have terminals arranged in a two-dimensional array across an underside surface of the device package. As a result, the physical dimensions of grid array device packages having hundreds of terminals are much smaller than their peripheral-terminal counterparts. Such smaller packages are highly desirable in portable device applications such as laptop and palmtop computers and hand-held communications devices such as cellular telephones. In addition, the lengths of signal lines from chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array ("BGA") device package. FIG. 1 is a cross-sectional view of an example BGA device 10. The device 10 includes an integrated circuit 12 mounted upon a larger package substrate 14. Substrate 14 includes two sets of bonding pads: a first set of bonding pads 16 on an upper surface adjacent to integrated circuit 12 and a second set of bonding pads 18 arranged in a two-dimensional array across an underside surface. Integrated circuit 12 includes a semiconductor substrate 20 having multiple electronic components formed within a circuit layer 22 upon a front side surface of semiconductor substrate 20 during wafer fabrication. The electronic components are connected by electrically conductive interconnect lines to form an electronic circuit. Multiple I/O pads 24 are also formed within circuit layer 22. I/O pads 24 are typically coated with solder to form solder bumps 26.

The integrated circuit is attached to the package substrate using the controlled collapse chip connection method, which is also known as the C4® or flip-chip method. During the C4 mounting operation, solder bumps 26 are placed in physical contact with corresponding members of the first set of bonding pads 16. Solder bumps 26 are then heated long enough for the solder to reflow. When the solder cools, I/O pads 24 of integrated circuit 12 are electrically and mechanically coupled to the corresponding members of the first set of bonding pads 16 of the package substrate. After integrated circuit 12 is attached to package substrate 14, the region between integrated circuit 12 and package substrate 14 is filled with an under-fill material 28 to encapsulate the C4 connections and provide additional mechanical benefits.

Package substrate 14 includes one or more layers of signal lines that connect respective members of the first set of bonding pads 16 and the second set of bonding pads 18. Members of the second set of bonding pads 18 function as device package terminals and are coated with solder, forming solder balls 30 on the underside surface of package substrate 14. Solder balls 30 allow BGA device 10 to be surface mounted to an ordinary PCB. During PCB assembly, BGA device 10 is attached to the PCB by reflow of solder balls 30 just as the integrated circuit is attached to the package substrate.

The C4 mounting of integrated circuit 12 to package substrate 14 prevents physical access to circuit layer 22 for failure analysis and fault isolation. Thus, an alternative approach is to construct an electrically conductive probe that extends from the backside 40 of the substrate 20 to selected signal lines in the interconnect layer 22. The criteria for choosing the signal lines are based upon those signal lines that are expected to be at a certain signal level in accordance with a given test. As the density of components on the substrate 20 increases, it is becoming increasingly difficult to construct a probe that extends between the components. That is, there is an increasing risk that the probe may make contact with a component, for example, the drain region of a transistor, or otherwise interfere with the desired electrical characteristics of the component. Therefore, a semiconductor structure that addresses the aforementioned problems associated with flip-chip testing is desired.

SUMMARY OF THE INVENTION

Generally, the present invention relates to a semiconductor structure having an electrically conductive probe that extends from the back side of an integrated circuit through the substrate to a selected region in the substrate.

In one embodiment, the invention is a semiconductor structure that comprises: a substrate having a first surface and a second surface; an active region disposed in and at the second surface of the substrate; and an electrically conductive probe extending from the first surface of the substrate to the active region.

In another embodiment, the semiconductor structure comprises: a substrate having a first surface and a second surface; a transistor including source and drain regions disposed in and at the second surface of the substrate; a well region surrounding the source and drain regions; and an electrically conductive probe extending from the first surface of the substrate to the well region.

A plurality of probes are provided in another embodiment of the invention. The semiconductor structure comprises: a substrate having a first surface and a second surface; a plurality of transistors, each including respective source and drain regions disposed in and at the second surface of the substrate; a plurality of well regions surrounding selected respective pairs of the source and drain regions; and a plurality of conductive probes extending from the first side of the substrate to selected ones of the source, drain, and well regions.

A semiconductor structure having probes that are electrically coupled is provided in another embodiment. The structure comprises a substrate having a first surface and a second surface. A plurality of active regions are disposed in the substrate, and a plurality of electrically conductive probes extend from the first surface of the substrate to selected ones of the source, drain, and well regions. An electrically insulative layer is disposed on the first surface of the substrate and extends between one or more selected pairs of the probes, and one or more electrically conductive lines are disposed on the insulative layer and respectively couple the selected one or more pairs of probes.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood upon consideration of the following detailed description of various embodiments of the invention in connection with the accompanying drawings, in which:

FIG. 6 is a cross-sectional view of a semiconductor structure having probes coupled to active regions in a substrate and coupled to one another.

Figure 1:
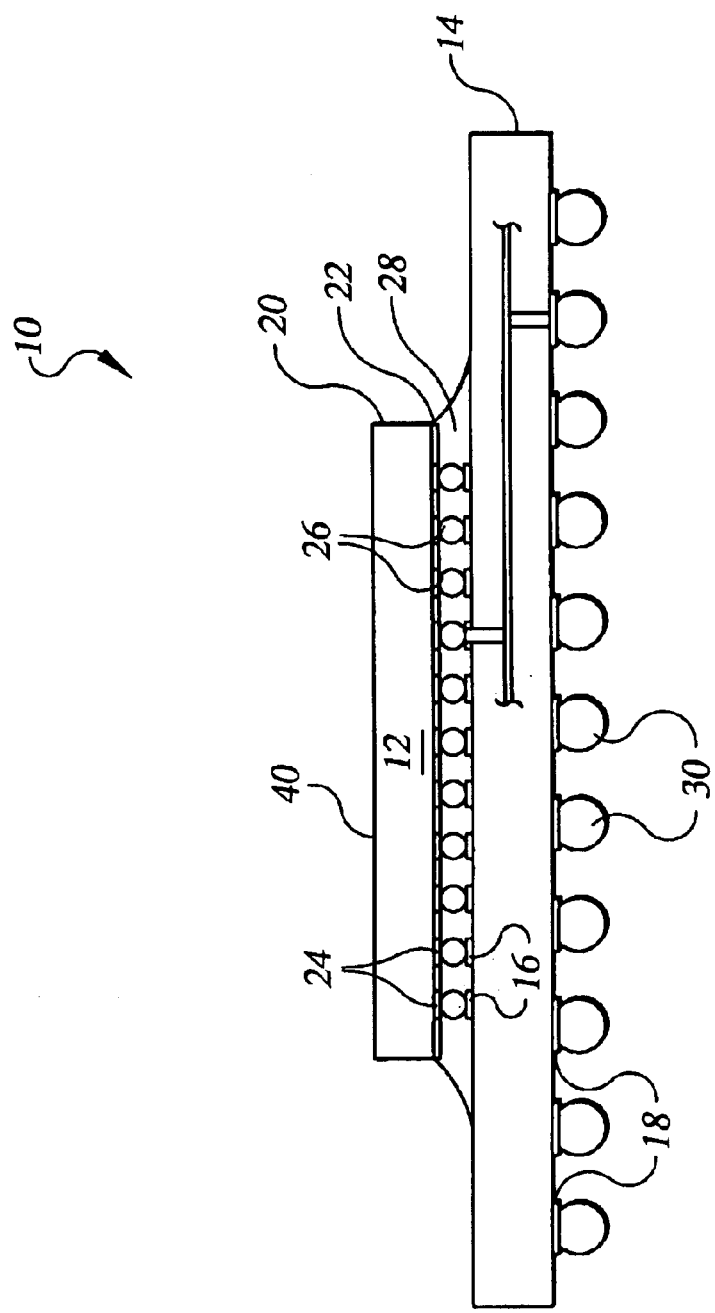
FIG. 1 cross-sectional view of an example ball grid array ("BGA") device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of flip-chip semiconductor structures. The invention has been found to be particularly advantageous in MOS devices, such as PMOS, NMOS, CMOS, or BICMOS devices. While the present invention is not so limited, an appreciation of various aspects of the invention is best gained through a discussion of various example semiconductor structures described below.

The invention permits access to desired signals of an integrated circuit by way of coupling electrically conductive probes from the back side of the integrated circuit to selected regions of the integrated circuit. Thus, the invention addresses the problems associated with the need to contact metal interconnect lines in the interconnect layer of the chip. The invention also addresses the problems associated with the need to locate areas between the active regions for the purpose of constructing probes through the substrate to contact a signal line, for example.

Figure 2:
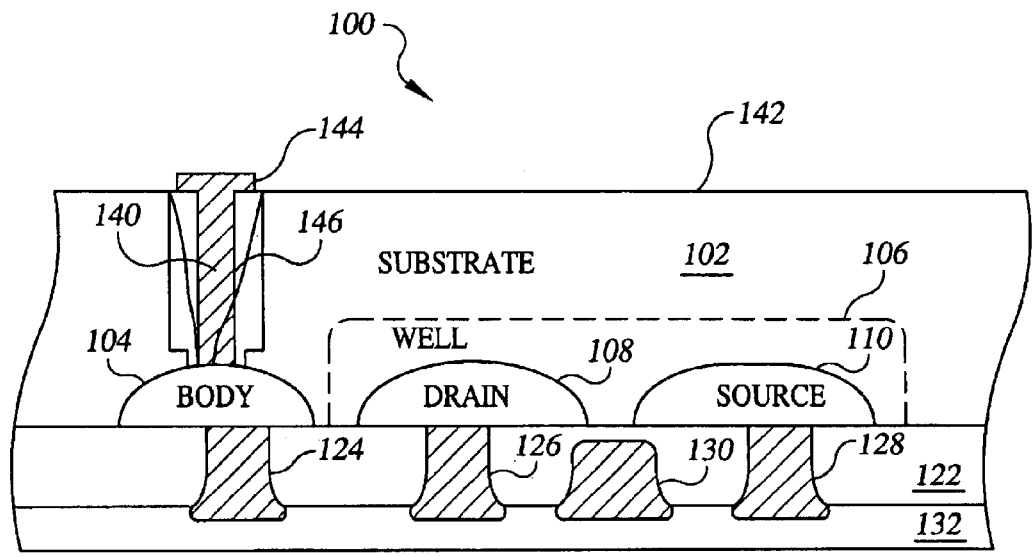
FIG. 2 is a cross-sectional view of an example semiconductor structure where an electrically conductive probe is coupled to an example active region according to an example embodiment of the invention.

FIG. 2 is a cross-sectional view of an example semiconductor structure 100 where an electrically conductive probe is coupled to an example active region according to an example embodiment of the invention. The structure 100 includes a substrate 102 in which are formed a body region 104, a well region 106, a drain region 108, and a source region 110. The substrate 102, along with the body, well, drain, and source regions 104–110 can be constructed using conventional semiconductor processes, and p-type and n-type dopants are used in the various regions in accordance with implementation requirements. The body, drain, and source regions 104, 108, and 110 are example "active" regions of the semiconductor structure 100.

The structure 100 also includes an electrically insulative layer 122 through which electrical conductors 124, 126, and 128 are respectively coupled to the body, drain, and source regions 104, 108, 110. A gate electrode 130 is arranged to switch the transistor formed by the drain region 108, source region 110, and gate electrode 130.

The electrical conductors 124, 126, 128, and 130 extend into the interconnect and passivation layer 132 where they are coupled to other signal lines (not shown) of the integrated circuit of which the structure 100 is a part.

The illustrated shapes of the elements 102–144 are intended to serve as examples. Those skilled in the art will recognize that a semiconductor structure can assume one of many different shapes depending on the particular implementation requirements for the integrated circuit.

In accordance with the example embodiment of FIG. 2, an electrically conductive probe 140 extends from the back side 142 and is coupled to an example one of the active regions, namely, the body region 104. Coupling the probe 140 to the body region 104 eliminates the need to locate an interconnect signal line (not shown) in the interconnect layer 132 that is coupled to the body region 104 and that at some location in the integrated circuit is accessible for constructing a probe.

The probe 140 includes a pad portion 144 that is large enough to make contact with conventional micro-probe test equipment. In addition, the probe 140 is electrically insulated from the substrate 102 with electrically insulative material 146.

To construct an example probe 140 where various active regions 104, 108, 110, have been formed in the substrate 102, a selected portion of the substrate at the desired location is etched away, leaving approximately 4–5 microns of substrate covering the region to be probed, body region 104, for example. A focused ion beam system can be used to create the final hole through the substrate to the region 104. The focused ion beam system can also be used to deposit the electrically insulative material 146.

It will be appreciated that a larger dimension probe hole requires less precision than does a relatively smaller dimension probe hole having a greater height. The methods used to insulate and fill such a hole with conductive material generally depends upon the aspect ratio of the hole, that is the ratio of depth:width. In one example method, the entire hole is filled with electrically insulative material, and the insulative material is then milled back to a selected width to expose a portion of the desired region. Then, a metal such as copper or aluminum is deposited to make contact with the desired region. A pad 144 is then deposited on the surface of the substrate to provide for electrical contact with, for example, a micro-probe or electron beam system.

Figure 3:
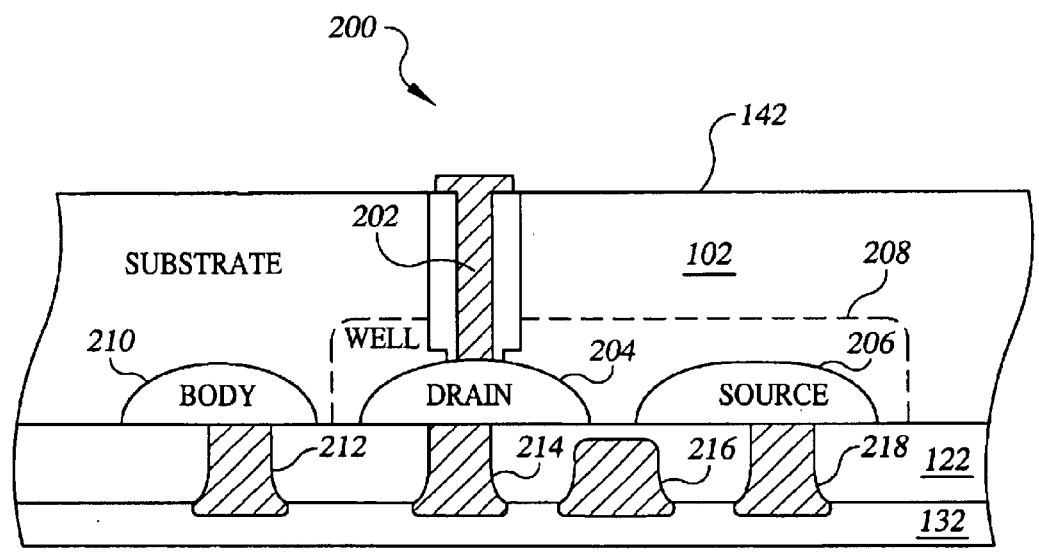
FIG. 3 is a cross-sectional view of an example embodiment of a semiconductor structure having an electrically conductive probe coupled to a drain region.

FIG. 3 is a cross-sectional view of an example embodiment of a semiconductor structure 200 having an electrically conductive probe 202 coupled to a drain region 204. It will be appreciated that coupling probe 202 to the drain region 204 eliminates the need to locate an interconnect signal line (not shown) that is coupled to the drain region 204 and that at some location in the integrated circuit is accessible for constructing a probe.

Source region 206, well region 208, body region 210, and electrical conductors 212, 214, 216, and 218 are similar to the corresponding elements described for structure 100 of FIG. 2.

Figure 4:
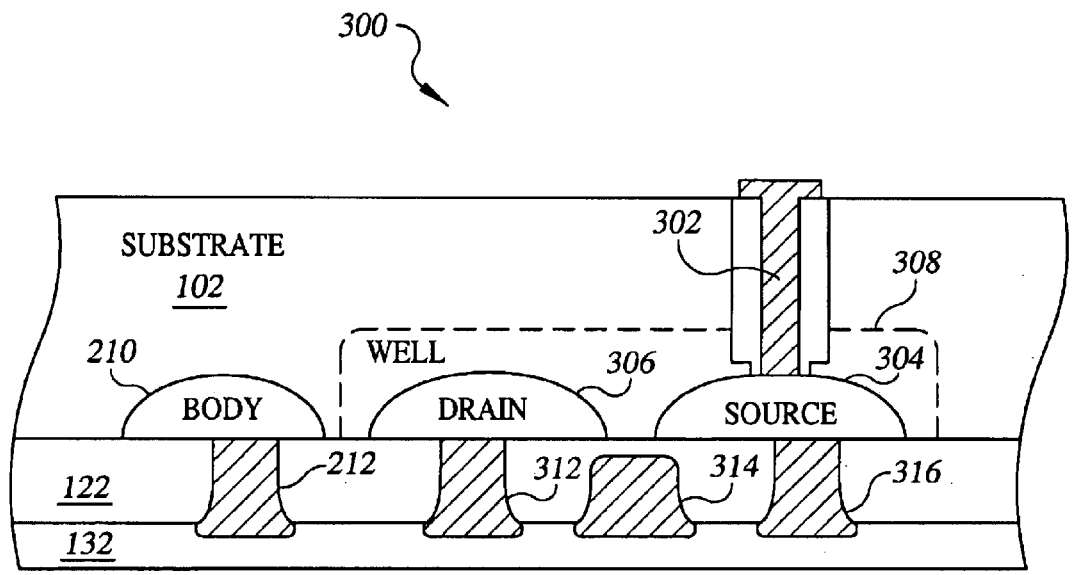
FIG. 4 is a cross-sectional view of an example semiconductor structure having an electrically conductive probe coupled to a source region.

FIG. 4 is a cross-sectional view of an example semiconductor structure 300 having an electrically conductive probe 302 coupled to a source region 304. It will be appreciated that coupling probe 302 to the source region 304 eliminates the need to locate an interconnect signal line (not shown) that is coupled to the source region 304 and that at some location in the integrated circuit is accessible for constructing a probe.

Drain region 306, well region 308, body region 210, and electrical conductors 212, 312, 314, and 316 are similar to the corresponding elements described for structure 100 of FIG. 2.

Figure 5:
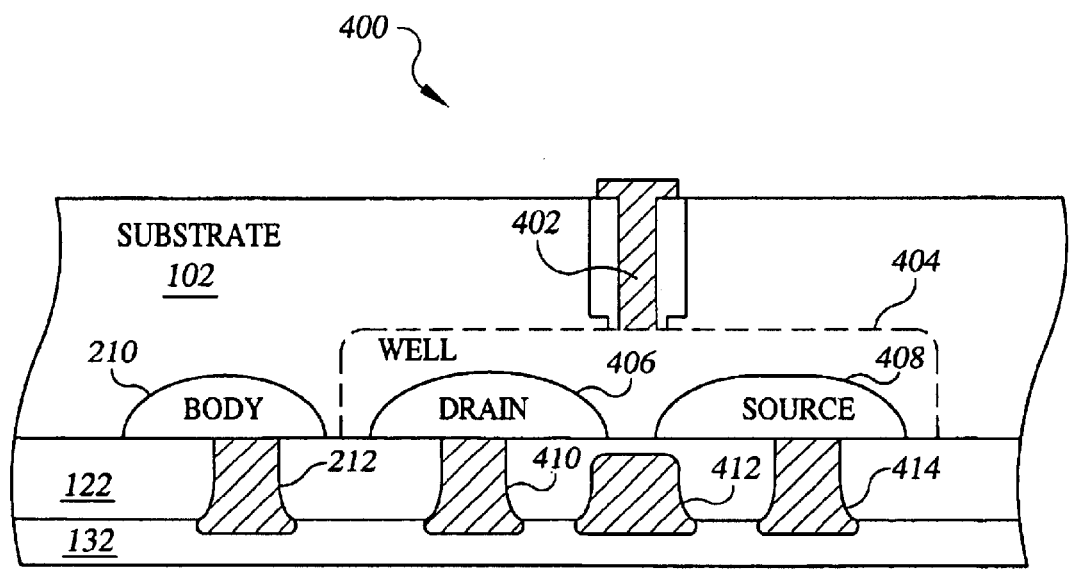
FIG. 5 is a cross-sectional view of an example embodiment of the invention in which a semiconductor structure has an electrically conductive probe coupled to a well region.

FIG. 5 is a cross-sectional view of an example embodiment of the invention in which a semiconductor structure 400 has an electrically conductive probe 402 coupled to a well region 404. Drain region 406, source region 408, and conductors 410, 412, and 414 are similar to the corresponding structures described for structure 100 of FIG. 2.

It will be appreciated that in addition to the above described semiconductor region, the invention can be used to establish an electrical connection to a variety of types of regions in an integrated circuit in order to monitor voltage levels, for example. An integrated circuit may also be constructed with a plurality of probes respectively coupled to a plurality of different regions in the integrated circuit for monitoring a plurality of voltage levels.

FIG. 6 is a cross-sectional view of a semiconductor structure 500 having probes coupled to active regions in a substrate and coupled to one another, according to an example embodiment. The structure 500 illustrates how the functionality of an integrated circuit can be changed without having to connect to metal lines in the interconnect layer 502. The probes 504 and 506 are coupled to example active regions 508 and 510, respectively. Depending upon the desired change in functionality, either or both of active regions 508 and 510 may alternatively be well regions.

To change the functionality of an integrated circuit formed on substrate 512, a thin electrically insulative layer 514 is formed on the surface 516 of substrate 512 between the desired probes 504 and 506. The insulative layer 514 can be silicon dioxide, for example, or alternatively, a thin film nitride layer. An electrically conductive interconnect 518 is then deposited on the insulative layer 514 to electrically couple probes 504 and 506.

As noted above, the present invention is applicable to a number of different semiconductor structures and arrangements. Accordingly, the present invention should not be considered limited to the particular examples described above, but rather should be understood to cover all aspects of the invention as fairly set out in the attached claims. Various modifications, equivalent structures, as well as numerous structures to which the present invention may be applicable will be readily apparent to those of skill in the art upon review of the present specification. The claims are intended to cover such modifications and devices.

What is claimed is:

1. An integrated circuit structure in a device package, comprising:

a package substrate including a first set of bonding pads on a first surface and a second set of bonding pads on a second surface;

a device substrate having an exposed back surface, a front surface, and a circuit interconnect layer disposed near the front surface and having a plurality of electronic components formed therein and a plurality of input/output pads connected to selected ones of the components and to respective ones of the second set of bonding pads of the package substrate;

an active region disposed in the device substrate between the interconnect layer and the back surface; and an electrically conductive probe extending from the back surface of the device substrate to the active region and terminating at the active region, the probe including a signal-coupling tip adapted to electrically couple to the active region.

2. The structure of claim 1, further comprising an electrically insulative region separating the conductive probe from the device substrate.

3. The E structure of claim 2, wherein the insulative region has a first diameter in a first portion that extends from the back surface of the E structure to a second portion having a second diameter where the probe meets the active region, wherein the second diameter is less than the first diameter.

4. The structure of claim 1, wherein the active region is a source region of a transistor.

5. The structure of claim 1, wherein the active region is a drain region of a transistor.

6. The structure of claim 1, further comprising:
   a transistor including source and drain regions disposed in the device substrate; and
   wherein the active region is a body region disposed in the substrate.

7. The structure of claim 1, further comprising:
   an electrically insulative layer having a first surface disposed on the back surface of the device substrate, and having a second surface;
   an interconnect layer disposed on the second surface of the insulative layer; and
   an electrical conductor extending from the interconnect layer through the insulative layer to the active region.

8. The structure of claim 7, further comprising an electrically insulative region separating the conductive probe from the device substrate.

9. The structure of claim 7, wherein the active region is a source region of a transistor.

10. The structure of claim 7, wherein the active region is a drain region of a transistor.

11. The structure of claim 7, further comprising:
    a transistor including source and drain regions disposed in the device substrate;
    wherein the active region is a body region disposed in the substrate.

12. An integrated circuit structure in a device package, comprising:
    a package substrate including a first set of bonding pads on a first surface and a second set of bonding pads on a second surface;
    a device substrate having an exposed back surface, a front surface, and a circuit interconnect layer disposed near the front surface and having a plurality of electronic components formed therein and a plurality of input/output pads connected to selected ones of the components and to respective ones of the second set of bonding pads of the package substrate;
    a transistor including source and drain regions disposed in the substrate between the interconnect layer and the back surface;
    a well region surrounding the source and drain regions; and
    an electrically conductive probe extending from the back surface of the device substrate to the well region and terminating at the well region, the probe including a signal-coupling tip adapted to electrically couple to the well region.

13. The structure of claim 12, further comprising an electrically insulative region separating the conductive probe from the device substrate.

14. An integrated circuit structure in a device package, comprising:
    a package substrate including a first set of bonding pads on a first surface and a second set of bonding pads on a second surface;
    a device substrate having an exposed back surface, a front surface, and a circuit interconnect layer disposed near the front surface and having a plurality of electronic components formed therein and a plurality of input/output pads connected to selected ones of the components and to respective ones of the second set of bonding pads of the package substrate;
    a plurality of transistors, each including respective source and drain regions disposed in the device substrate between the interconnect layer and the back surface;
    a plurality of well regions surrounding selected respective pairs of the source and drain regions; and
    a plurality of electrically conductive probes extending from the back surface of the device substrate to selected respective ones of the source, drain, and well regions and terminating at the selected respective ones of the source, drain and well regions, each probe including a signal-coupling tip adapted to electrically couple to the selected region at which it terminates.

15. The structure of claim 14, further comprising a plurality of respective electrically insulative regions separating the conductive probes from the device substrate.

16. An integrated circuit structure in device package, comprising:
    a package substrate including a first set of bonding pads on a first surface and a second set of bonding pads on a second surface;
    a device substrate having an exposed back surface, a front surface, and a circuit interconnect layer disposed near the front surface and having a plurality of electronic components formed therein and a plurality of input/output pads connected to selected ones of the components and to respective ones of the second set of bonding pads of the package substrate;
    a plurality of active regions disposed in the device substrate between the interconnect layer and the back surface;
    a plurality of electrically conductive probes extending from the back surface of the device substrate to respective ones of the active regions and terminating at the respective active regions, each probe including a signal-coupling tip adapted to electrically couple to the respective active region at which it terminates;
    an electrically insulative layer disposed on the back surface of the device substrate and extending between one or more selected pairs of the probes; and
    one or more electrically conductive lines disposed on the insulative layer and respectively coupling the selected one or more pairs of probes.

17. The structure of claim 16, wherein the active regions are source regions and drain regions of transistors.

18. The structure of claim 17, further comprising:
    well regions disposed in the device substrate;
    wherein one or more of the probes are respectively coupled to one or more of the well regions.

19. An integrated circuit structure comprising:
    a substrate having an exposed back surface, a front surface, and a circuit interconnect layer disposed near the front surface, the interconnect layer having a plurality of electronic components formed therein;
    an active region disposed in the substrate between the interconnect layer and the back surface, the active region being at least one of: a source, drain or well;
    an electrically conductive probe extending from the back surface of the substrate and terminating at the active region.

20. The structure of claim 19, wherein the electrically conductive probe is adapted to obtain an electrical characteristic directly from the active region.

21. The structure of claim 19, wherein the probe is adapted to obtain the electrical characteristic without contacting the interconnect layer.

22. The structure of claim 19, wherein the probe is formed completely outside of the interconnect layer.

23. The structure of claim 19, further comprising an electrically conductive contact pad disposed on the probe at the back surface.

* * * * *

UNITED STATES PATENT AND TRADEMARK OFFICE
CERTIFICATE OF CORRECTION

PATENT NO. : 6,720,641 B1
DATED : April 13, 2004
INVENTOR(S) : Birdsley et al.

It is certified that error appears in the above-identified patent and that said Letters Patent is hereby corrected as shown below:

Column 1,
Line 7, "related to patent" should read -- related to copending patent --.

Column 6,
Line 66, delete "E".

Column 7,
Line 1, delete "E".

Signed and Sealed this

Twentieth Day of July, 2004

JON W. DUDAS
*Acting Director of the United States Patent and Trademark Office*